(12) United States Patent
Huang et al.

(10) Patent No.: US 10,971,502 B2
(45) Date of Patent: Apr. 6, 2021

(54) SRAM STRUCTURE

(71) Applicant: UNITED MICROELECTRONICS CORP., Hsin-Chu (TW)

(72) Inventors: Chien-Hui Huang, Kaohsiung (TW); Tsung-Hsun Wu, Kaohsiung (TW); Po-Lin Chen, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 136 days.

(21) Appl. No.: 16/297,722

(22) Filed: Mar. 11, 2019

(65) Prior Publication Data

US 2020/0258891 A1    Aug. 13, 2020

(30) Foreign Application Priority Data

Feb. 12, 2019  (TW) ................................. 108104532

(51) Int. Cl.
*H01L 27/11* (2006.01)
*H01L 23/528* (2006.01)
*G11C 11/412* (2006.01)

(52) U.S. Cl.
CPC ........ *H01L 27/1104* (2013.01); *G11C 11/412* (2013.01); *H01L 23/528* (2013.01)

(58) Field of Classification Search
None
See application file for complete search history.

(56) References Cited

U.S. PATENT DOCUMENTS

| | | | | |
|---|---|---|---|---|
| 2001/0043487 | A1* | 11/2001 | Nii ........................... | G11C 7/18 365/154 |
| 2002/0190292 | A1* | 12/2002 | Karasawa ........... | H01L 27/1104 257/296 |
| 2008/0079077 | A1* | 4/2008 | Takeda ................ | H01L 27/1108 257/351 |
| 2015/0357279 | A1* | 12/2015 | Fujiwara ............. | H01L 27/1104 257/499 |

* cited by examiner

*Primary Examiner* — Nicholas J Tobergte
*Assistant Examiner* — Kien C Ly
(74) *Attorney, Agent, or Firm* — Winston Hsu

(57) ABSTRACT

An SRAM structure includes a substrate. A first active region, a second active region, a third active region and a fourth active region are disposed on the substrate. A first gate structure includes a first part, a second part and a third part disposed on the substrate. The first part and the third part are perpendicular to the first active region. The second part is parallel to the first active region. The first part covers the first active region, the second active region and the fourth active region. The third part covers the fourth active region. The second part is disposed on an insulating region between the second active region and the fourth active region, and the second part contacts the first part and the third part.

17 Claims, 6 Drawing Sheets

SRAM STRUCTURE

BACKGROUND OF THE INVENTION

1. Field of the Invention

The present invention relates to an SRAM (static random access memory) structure, and more particularly to a 10T (10-transistor) SRAM structure.

2. Description of the Prior Art

A static random access memory (SRAM) cell comprises a logic circuit connected to a static random access memory. An SRAM is a kind of volatile memory cell, which means it preserves data only while power is continuously applied. An SRAM is built of cross-coupled inverters that store data while power remains applied, unlike a dynamic random access memory (DRAM) which needs to be periodically refreshed. SRAM is also used in computer systems as a cache memory.

SRAM is typically arranged as a matrix of thousands of individual memory cells fabricated in an integrated circuit chip. Address decoding in the chip allows access to each cell for read/write functions. SRAM memory cells use active feedback from cross-coupled inverters in the form of a latch to store or "latch" a bit of information. These SRAM memory cells are often arranged in rows and columns so that blocks of data such as words or bytes can be written or read simultaneously. Standard SRAM memory cells have many variations.

As the speed of electronic elements increases, however, the SRAM needs to achieve a higher performance.

SUMMARY OF THE INVENTION

Accordingly, it is a primary object of the present invention to provide an SRAM structure with higher performance.

According to a preferred embodiment of the present invention, an SRAM structure includes a substrate. A first active region, a second active region, a third active region and a fourth active region are disposed on the substrate, wherein the first active region, the second active region, the third active region and the fourth active region are parallel to each other, do not connect to each other structurally and are arranged from left to right in a sequence of the third active region, the first active region, the second active region and the fourth active region. A first gate line including a first part, a second part and a third part is disposed on the substrate, wherein the first part and the third part are perpendicular to the first active region, the second part is parallel to the first active region, the first part covers the first active region, the second active region and the fourth active region, the third part covers the fourth active region, the second part is disposed on an insulating region between the second active region and the fourth active region, and the second part contacts the first part and the third part. A second gate line including a fourth part, a fifth part and a sixth part is disposed on the substrate, wherein the fourth part and the sixth part are perpendicular to the first active region, the fifth part is parallel to the first active region, the fourth part covers the first active region, the second active region and the third active region, the sixth part covers the third active region, and the fifth part covers the insulating region between the first active region and the third active region and contacts the fourth part and the sixth part.

According to another preferred embodiment of the present invention, an SRAM structure includes a structure. A fifth active region, a third active region, a first active region, a second active region, a fourth active region and a sixth active region are arranged in a sequence from left to right on the substrate, wherein the first active region, the second active region, the third active region, the fourth active region, the fifth active region and the sixth active region are parallel to each other. A seventh active region contacts the third active region and the fifth active region, wherein the seventh active region is perpendicular to the fifth active region. An eighth active region contacts the fourth active region and the sixth active region, wherein the eighth active region is perpendicular to the sixth active region. A first gate line covers the first active region, the second active region and the fourth active region. A second gate line covers the fourth active region, wherein the second gate line is parallel to the first gate line. A third gate line covers the first active region, the second active region and the third active region. A fourth gate line covers the third active region, wherein the fourth gate line is parallel to the third gate line. A first metal line electrically connects to the first gate line and the second gate line, wherein the first metal line is perpendicular to the eighth active region. A second metal line electrically connects to the third gate line and the fourth gate line, wherein the second metal line is perpendicular to the seventh active region.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
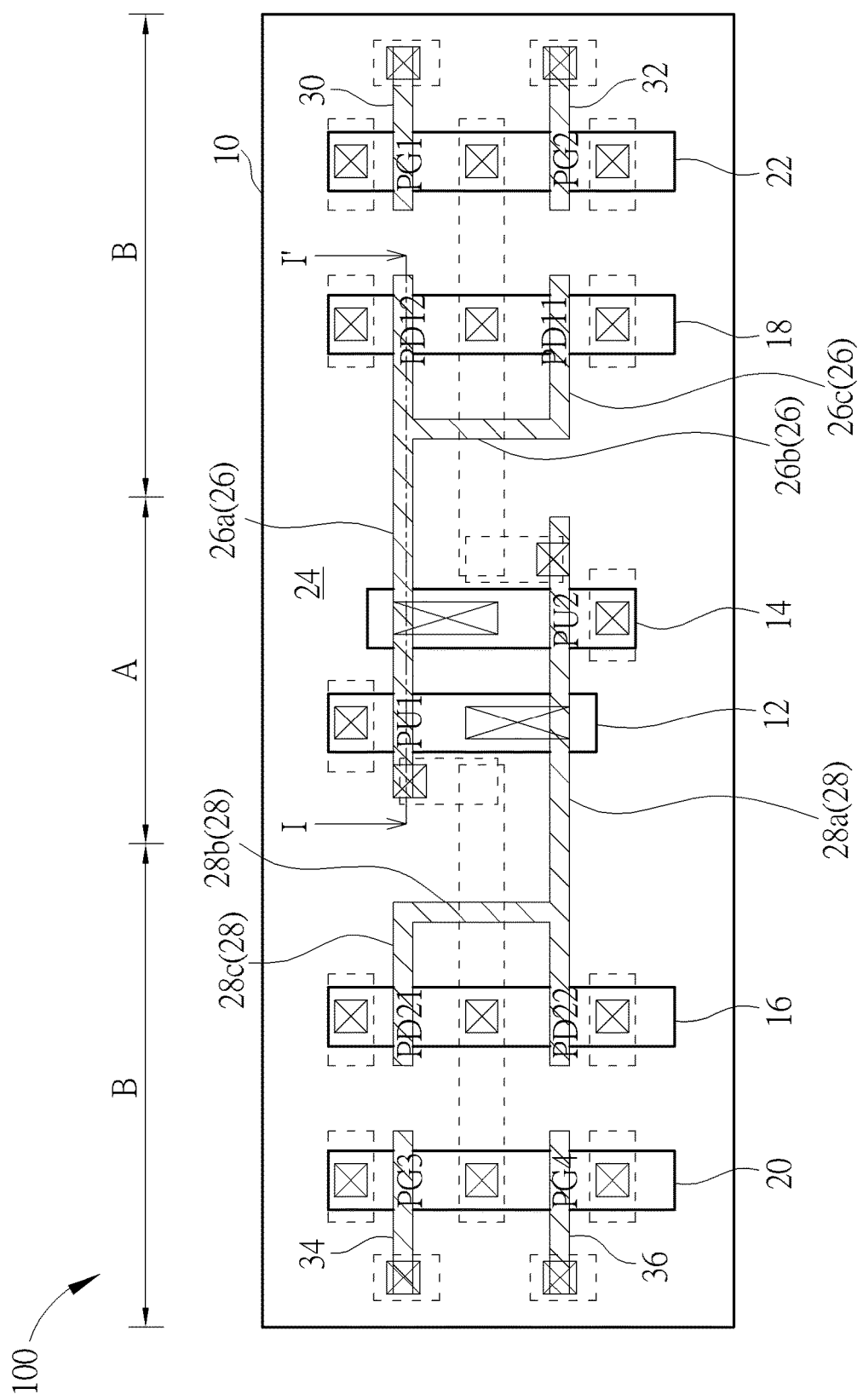
FIG. 1 depicts a top view of an SRAM structure according to a first preferred embodiment of the present invention.
Figure 2:
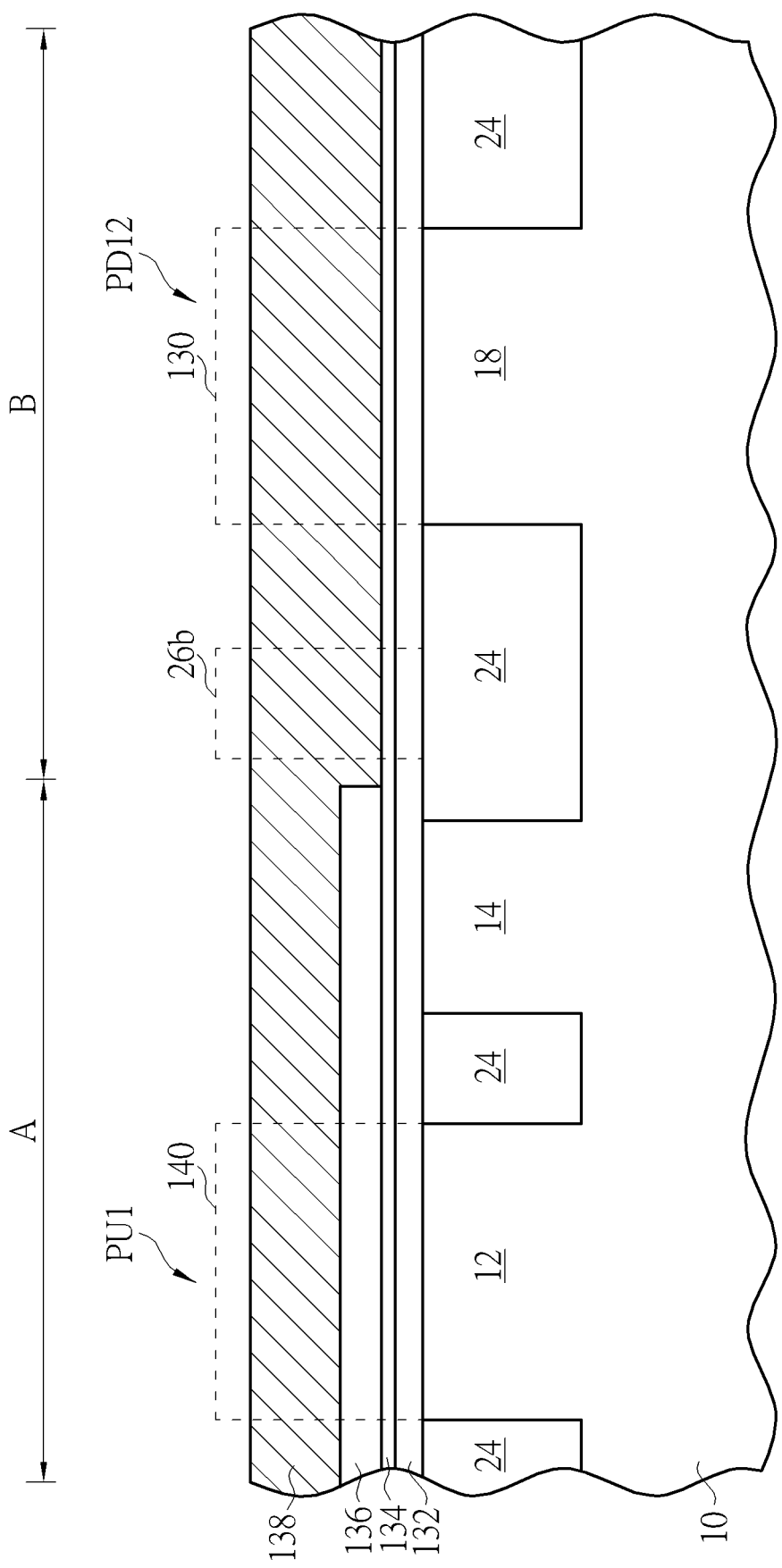
FIG. 2 depicts a sectional view taken along a line I-I' shown in FIG. 1.

FIG. 1 depicts a top view of an SRAM structure according to a first preferred embodiment of the present invention. FIG. 2 depicts a sectional view taken along a line I-I' shown in FIG. 1.

As shown in FIG. 1, a 10T SRAM structure 100 is provided. The 10T SRAM structure 100 includes a substrate 10. A first active region 12, a second active region 14, a third active region 16, a fourth active region 18, a fifth active region 20 and a sixth active region 22 are disposed on the substrate 10. The first active region 12, the second active region 14, the third active region 16, the fourth active region 18, the fifth active region 20 and the sixth active region 22 are parallel to each other. The first active region 12, the second active region 14, the third active region 16, the fourth active region 18, the fifth active region 20 and the sixth active region 22 are arranged from left to right in a sequence of the fifth active region 20, the third active region 16, the first active region 12, the second active region 14 and the fourth active region 18 and the sixth active region 22. A insulating region 24 is disposed between the first active region 12, the second active region 14, the third active region 16, the fourth active region 18, the fifth active region 20 and the sixth active region 22 to prevent the regions from contacting each structurally.

A first gate line 26 covers the first active region 12, the second active region 14, the fourth active region 18 and the insulating region 24. The first gate line 26 is formed by a first part 26a, a second part 26b and a third part 26c. The first part 26a and the third part 26c are perpendicular to the first active region 12. The second part 26b is parallel to the first active region 12. It is noteworthy that the second part 26b is disposed on the insulating region 24 between the second active region 14 and the fourth active region 18. Furthermore, two ends of the second part 26b respectively directly contact the first part 26a and the third part 26c. The first part 26a continuously covers the first active region 12, the second active region 14, the fourth active region 18 and the insulating region 24 between the first active region 12, the second active region 14, and the fourth active region 18. The third part 26c covers the fourth active region 18 and the insulating region 24 between the fourth active region 18 and the second active region 14. The third part 26c does not cover the second active region 14 and the sixth active region 22. The first part 26a and the third part 26c do not contact each other structurally. Moreover, the first gate line 26 is a continuous structure.

A second gate line 28 covers the second active region 14, the first active region 12 and the third active region 16. The second gate line 28 is formed by a fourth part 28a, a fifth part 28b and a sixth part 28c. The fourth part 28a and the sixth part 28c are perpendicular to the first active region 12. The fifth part 28b is parallel to the first active region 12. The fourth part 28a continuously covers the first active region 12, the second active region 18, the third active region 16 and the insulating region 24. The sixth part 28c covers the third active region 16 and the insulating region 24 between the first active region and the third active region 16. Part of the sixth part 28c does not cover the first active region 12 and the second active 14. The fifth part 28b covers the insulating region 24 between the first active region 12 and the third active region 16. Two ends of the fifth active region 28b respectively directly contact the fourth part 28a and the sixth part 28c. The fourth part 28a and the sixth part 28c do not contact each other structurally. The second gate line 28 is a continuous structure.

A third gate line 30 covers the sixth active region 22 and the insulating region 24. A fourth gate line 32 covers the sixth active region 22 and the insulating region 24. A fifth gate line 34 covers the fifth active region 20 and the insulating region 24. A sixth gate line 36 covers the fifth active region 20 and the insulating region 24.

A first pull down transistor PD21 and a second pull down transistor PD22 are disposed in the third active region 16. In detail, the sixth part 28c overlapping the third active region 16 serves as a gate of the first pull down transistor PD21. The fourth part 28a overlapping the third active region 16 serves as a gate of the second pull down transistor PD22. A third pull down transistor PD11 and a fourth pull down transistor PD12 are disposed in the fourth active region 18. The first part 26a overlapping the fourth active region 18 serves as a gate of the fourth pull down transistor PD12. The third part 26c overlapping the fourth active region 18 serves as a gate of the third pull down transistor PD11. A first pull up transistor PU1 is disposed in the first active region 12. The first part 26a overlapping the first active region 12 serves as a gate of the first pull up transistor PU1. A second pull up transistor PU2 is disposed in the second active region 14. The fourth part 28a overlapping the second active region 14 serves as a gate of the second pull up transistor PU2. A first passing gate transistor PG1 and a second passing gate transistor PG2 are disposed in the sixth active region 22. The third gate line 30 overlapping the sixth active region 22 serves as a gate of the first passing gate transistor PG1. The fourth gate line 32 overlapping the sixth active region 22 serves as a gate of the second passing gate transistor PG2. A third passing gate transistor PG3 and a fourth passing gate transistor PG4 are disposed in the fifth active region 20. The fifth gate line 34 overlapping the fifth active region 20 serves as a gate of the third passing gate transistor PG3. The sixth gate line 36 overlapping the fifth active region 20 serves as a gate of the fourth passing gate transistor PG4.

The substrate 10 is divided into a P-type transistor region A and two N-type transistor regions B. The first pull up transistor PU1 and the second pull up transistor PU2 are both within the P-type transistor region A. Other transistors such as the first pull down transistor PD21, the second pull down transistor PD22, the third pull down transistor PD11, the fourth pull down transistor PD12, the first passing gate transistor PG1, the second passing gate transistor PG2, the third passing gate transistor PG3 and the fourth passing gate transistor PG4 are within the N-type transistor regions B. As shown in FIG. 1 and FIG. 2, because the second part 26b is within the N-type transistor regions B, the structure of the second part 26b is the same as the structures of the gates within the N-type transistor regions B. For example, the structure of the second part 26b is the same as the structure of the gate of the fourth pull down transistor PD12. The fifth part 28b is also within the N-type transistor regions B. In this way, the structure of the fifth part 28b is the same as that of the second part 26b, i.e. the structure of the fifth part 28b is the same as the structures of the gates within the N-type transistor regions B. Refer to the sectional view of the second part 26b for the sectional view of the fifth part 28b. As shown in FIG. 2, in the N-type transistor regions B, the gate 130 (marked by dashed lines) of the fourth pull down transistor PD12 and the second part 26b (marked by dashed lines) include a gate dielectric layer 132, an N-type work function layer 134 and a metal gate 138. In the P-type transistor region A, the gate 140 (marked by dashed lines) of the first pull up transistor PU1 includes a gate dielectric layer 132, an N-type work function layer 134, a P-type work function layer 136 and a metal gate 138. The gate 140 in the P-type transistor region A has the P-type work function layer 136; however, the gate 130 in the N-type transistor regions B also has the P-type work function layer 136.

Figure 3:
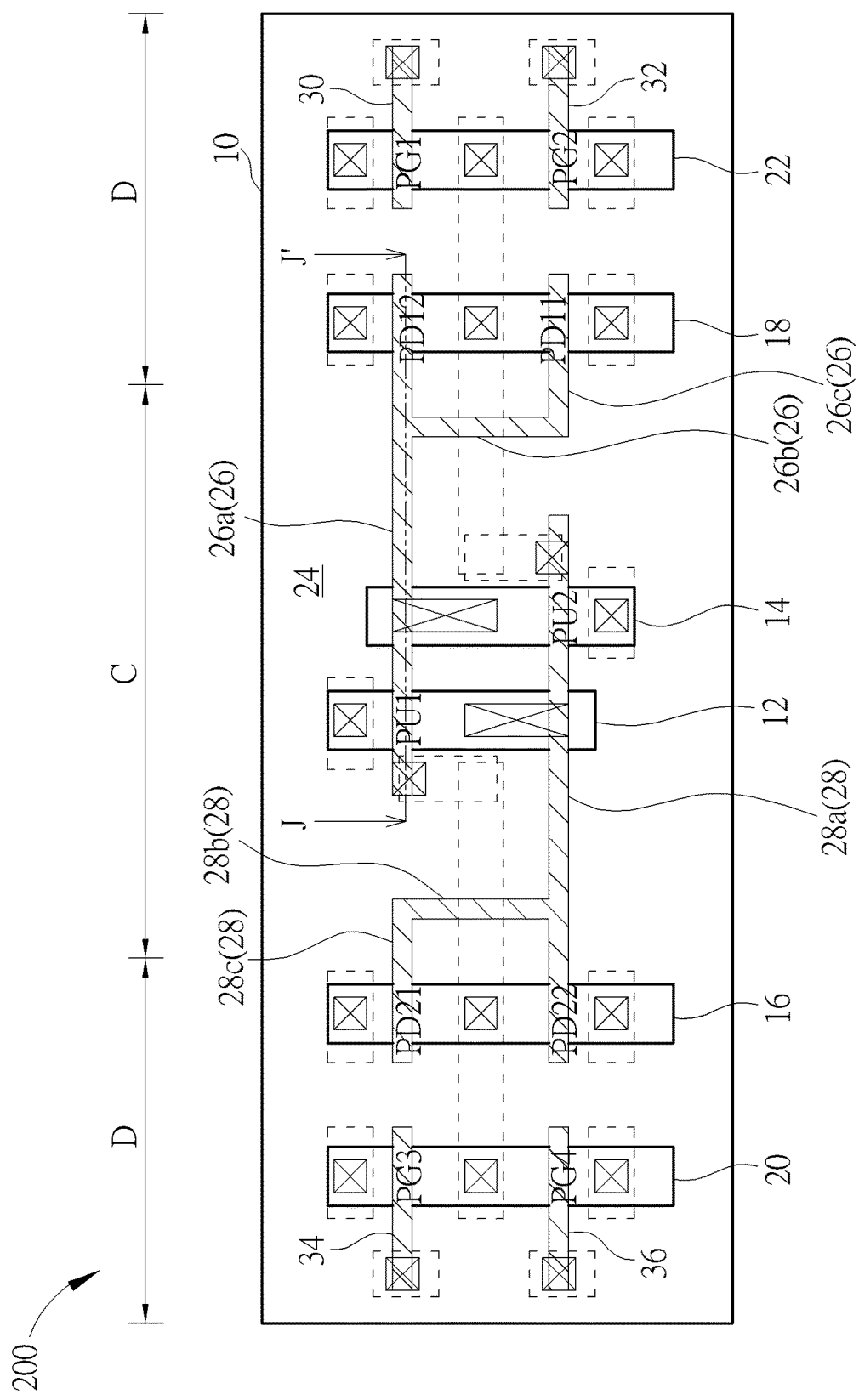
FIG. 3 depicts a top view of an SRAM structure according to a second preferred embodiment of the present invention.
Figure 4:
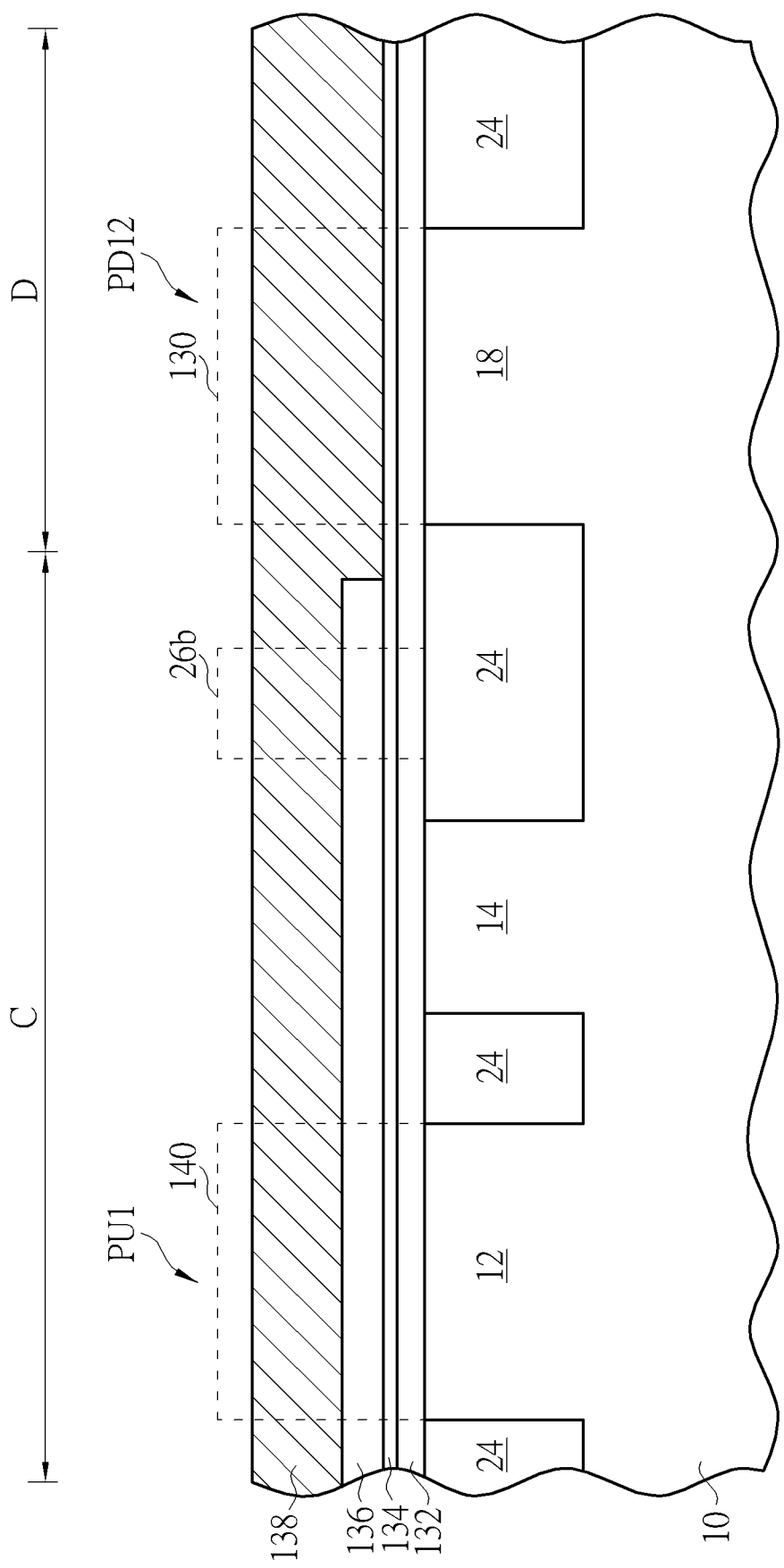
FIG. 4 depicts a sectional view taken along a line J-J' shown in FIG. 3.

FIG. 3 depicts a top view of an SRAM structure according to a second preferred embodiment of the present invention. FIG. 4 depicts a sectional view taken along a line J-J' shown in FIG. 3, wherein elements which are substantially the same as those in the first preferred embodiment are denoted by the same reference numerals; an accompanying explanation is therefore omitted. The difference between the first preferred embodiment and the second preferred embodiment is that the second part 26b and the fifth part 28b of the second preferred embodiment are within the P-type transistor region C. In the first preferred embodiment, the second part 26b and the fifth part 28b are within the N-type transistor region B. Other elements in the second preferred embodiment are the same as those in the first preferred embodiment. As shown in FIG. 3 and FIG. 4, the second part 26b is in the P-type transistor region C, but the first pull down transistor PD21, the second pull down transistor PD22, the third pull down transistor PD11, the fourth pull down transistor PD12, the first passing gate transistor PG1, the second passing gate transistor PG2, the third passing gate transistor PG3 and the fourth passing gate transistor PG4 are in the N-type transistor regions D. The structure of the second part 26b and the structure of the gate 140 (marked by dashed lines) of the first pull up transistor PU1 are the same. According to the first preferred embodiment and the second preferred embodiment of the present invention, the structures of the second part 26b and the fifth part 28b can be optionally disposed in the N-type transistor regions or the P-type transistor region based on different product requirements. By optionally disposing the P-type work function layer 136 in the second part 26b and the fifth part 28b, the threshold voltages of the first pull up transistor PU1 and the second pull up transistor PU2 can be adjusted.

Figure 5:
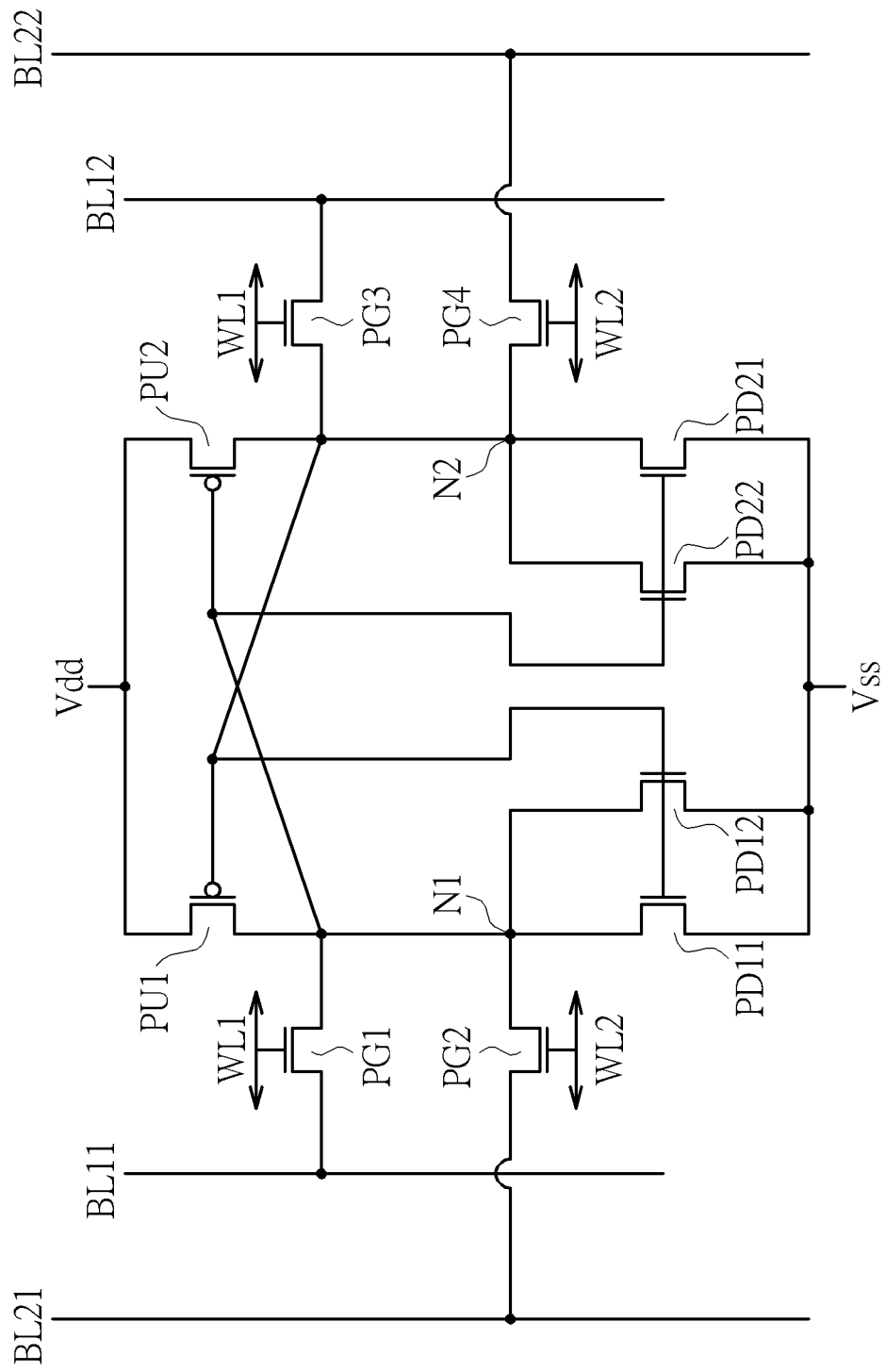
FIG. 5 depicts an equivalent circuit diagram of the first preferred embodiment and the second preferred embodiment.

FIG. 5 depicts an equivalent circuit diagram of the first preferred embodiment and the second preferred embodiment. As shown in FIG. 5, the drain of the first passing gate transistor PG1 electrically connects to the bit line BL11. The source of the first passing gate PG1 electrically connects to the drain of the third pull down transistor PD11. The gate of the first passing gate transistor PG1 electrically connects to the word line WL1. The source of the third pull down transistor PD11 electrically connects to a source voltage Vss. The drain of the second passing gate transistor PG2 electrically connects to the word line WL2. The source of the second passing gate transistor PG2 electrically connects the drain of the fourth pull down transistor PD12. The gate of the second passing gate transistor PG2 electrically connects to the word line WL2. The drain of the third passing gate transistor PG3 electrically connects to the bit line BL12. The source of the third passing gate transistor PG3 electrically connects to the drain of the first pull down transistor PD21. The gate of the third passing gate transistor PG3 electrically connects to the word line WL1. The source of the first pull down transistor PD21 electrically connects to the source voltage Vss. The drain of the passing gate transistor PG4 electrically connects to the bit line BL22. The source of the fourth passing gate transistor PG4 electrically connects to the drain of the third pull down transistor PD11. The gate of the fourth passing gate transistor PG4 electrically connects to the word line WL2. The source of the second pull down transistor PD22 electrically connects to the source voltage Vss.

Figure 6:
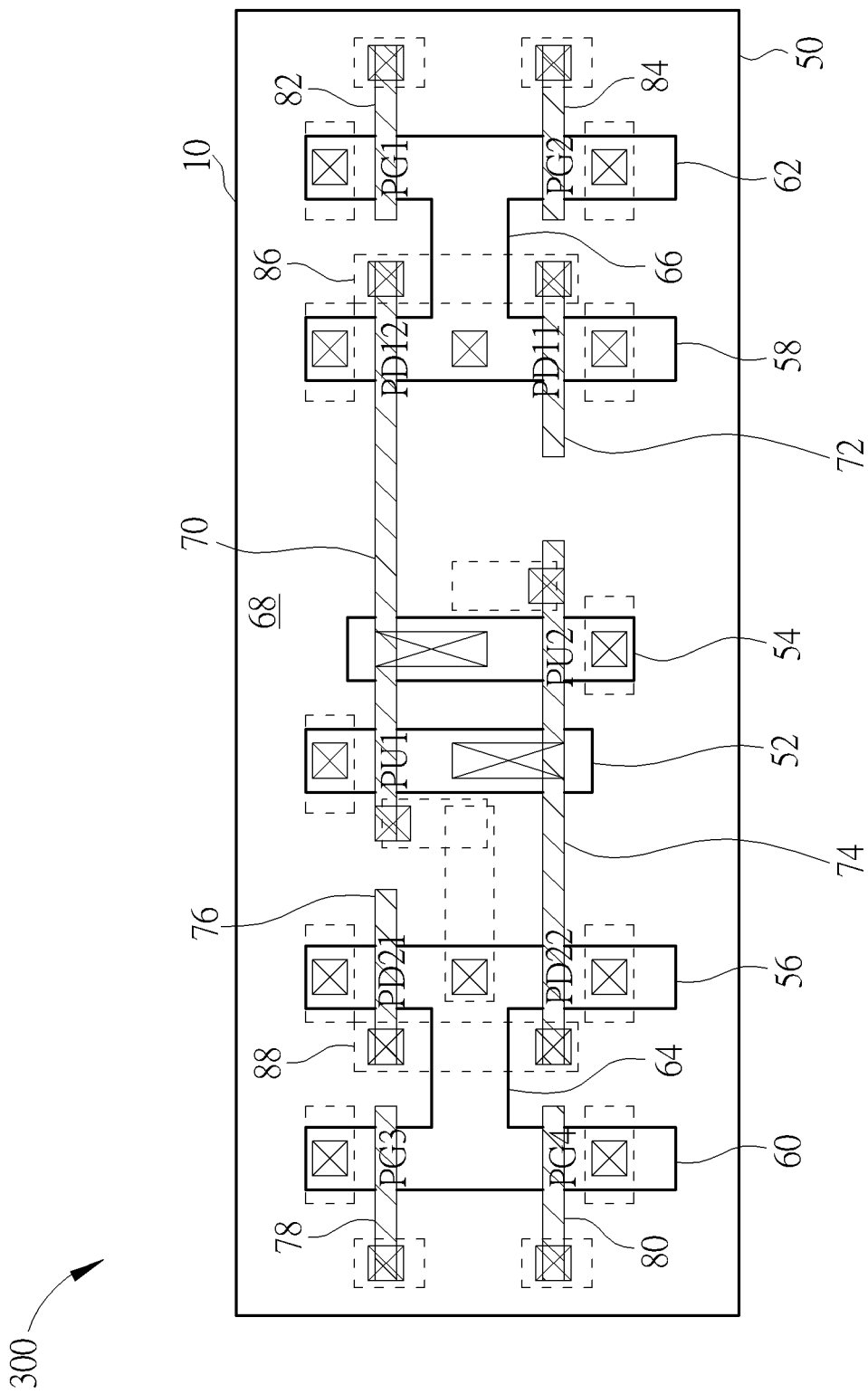
FIG. 6 depicts an SRAM structure according to a third preferred embodiment of the present invention.

The drain of the first pull up transistor PU1, the drain of the third pull down transistor PD11 and the drain of the fourth pull down transistor PD12 are electrically connected to each other and connect to a node N1. The gate of the third pull down transistor PD11, the gate of the fourth pull down transistor PD12 and the gate of the first pull up transistor PU1 are electrically connected to each other and connect to a node N2. The drain of the second pull up transistor PU2, the drain of the first pull down transistor PD21 and the drain of the second pull down transistor PD22 are electrically connected to each other and connect to a node N2. The gate of the first pull down transistor PD21, the gate of the second pull down transistor PD22 and the gate of the second pull up transistor PU2 are electrically connected to each other and connect to the node N1. The source of the first pull up transistor PU1 and the source of the second pull up transistor PU2 are electrically connected to the drain voltage Vdd. Moreover, the first pull up transistor PU1, the second pull up transistor PU2, the first pull down transistor PD21, the third pull down transistor PD11 and the fourth pull down transistor PD12 form two cross-coupled inverters. The first passing gate transistor PG1 and the third passing gate transistor PG3 serve as a first terminal of the two cross-coupled inverters, and the second passing gate transistor PG2 and the fourth gate transistor PG4 serve as a second terminal of the two cross-coupled inverters FIG. 6 depicts an SRAM structure according to a third preferred embodiment of the present invention, wherein elements which are substantially the same as those in the first preferred embodiment are denoted by the same reference numerals; an accompanying explanation is therefore omitted. As shown in FIG. 6, a 10T SRAM structure 300 includes a substrate 50, a fifth active region 60, a third active region 56, a first active region 52, a second active region 54, a fourth active region 58 and a sixth active region 62 arranged in a sequence from left to right on the substrate 50. The first active region 52, the second active region 54, the third active region 56, the fourth active region 58, the fifth active region 60 and the sixth active region 62 are parallel to each other. The first active region 52, the second active region 54, the third active region 56, and the fourth active region 58 do not connect to each other structurally. Two ends of the seventh active region 64 respectively directly contact the third active region 56 and the fifth active region 60. The seventh active region 64 is perpendicular to the fifth active region 60. The third active region 56, the fifth active region 60 and the seventh active region 64 form an H-shape. Two ends of the eighth active region 66 respectively directly contact the fourth active region 58 and the sixth active region 62. The eighth active region 66 is perpendicular to the sixth active region 62. The eighth active region 66, the fourth active region 58 and the sixth active region 62 form another H-shape. An insulating region 68 is disposed between the first active region 52, the second active region 54, the third active region 56, the fourth active region 58, the fifth active region 60, the sixth active region 62, the seventh active region 64 and the eighth active region 66.

A first gate line 70 continuously covers the first active region 52, the second active region 54, the fourth active region 58 and the insulating region 68. A second gate line 72 covers the fourth active region 58. The second gate line 72 is parallel to the first gate line 70. The second gate line 72 does not cover the sixth active region 62 and the second active region 54. A third gate line 74 continuously covers the first active region 52, the second active region 54, the third active region 56 and the insulating region 68. A fourth gate line 76 covers the third active region 56. The fourth gate line 76 is parallel to the third gate line 74, but the fourth gate line 76 does not cover the first active region 52 and the fifth active region 60. The first metal line 86 electrically connects to the first gate line 70 and the second gate line 72, wherein the first metal line 86 is perpendicular to the eighth active region 66. Part of the first metal line 86 overlaps the eighth active region 66. A second metal line 88 electrically connects to the third gate line 74 and the fourth gate line 76, wherein the second metal line 88 is perpendicular to the seventh active region 64.

A first pull down transistor PD21 and a second pull down transistor PD22 are disposed in the third active region 56. The fourth gate line 76 overlapping the third active region 56 serves as a gate of the first pull down transistor PD21. The gate line 74 overlapping the third active region 56 serves as a gate of the second pull down transistor PD22. A third pull down transistor PD11 and a fourth pull down transistor PD12 are disposed in the fourth active region 58. The first gate line 70 overlapping the fourth active region 58 serves as a gate of the fourth pull down transistor PD12. The second gate line 72 overlapping the fourth active region 58 serves as a gate of the third pull down transistor PD11. A first pull up transistor PU1 is disposed in the first active region 52. The first gate line 70 overlapping the first active region 52 serves as a gate of the first pull up transistor PU1. A second pull up transistor PU2 is disposed in the second active region 54. The third gate line 74 overlapping the second active region 54 serves as a gate of the second pull up transistor PU2. A first passing gate transistor PG1 and a second passing gate transistor PG2 are disposed in the sixth active region 62. The seventh gate line 82 overlapping the sixth active region 62 serves as a gate of the first passing gate transistor PG1. The eighth gate line 84 overlapping the sixth active region 62 serves as a gate of the second passing gate transistor PG2. A third passing gate transistor PG3 and a fourth passing gate transistor PG4 are disposed in the fifth active region 60. The fifth gate line 78 overlapping the fifth active region 60 serves as a gate of the third passing gate transistor PG3. The sixth gate line 80 overlapping the fifth active region 60 serves as a gate of the fourth passing gate transistor PG4. Furthermore, the metal lines are marked by dashed lines in FIG. 6.

The equivalent circuit diagram of the third preferred embodiment is largely the same as that of the first preferred embodiment. See FIG. 5 for the equivalent circuit diagram of the third preferred embodiment.

In the third preferred embodiment, the first metal line 86 is used to replace the second part 26b of the first gate line 26 in the first preferred embodiment. The second metal line 88 is used to replace the fifth part 28b of the second gate line 28 in the first preferred embodiment. As shown in FIG. 1, according to the first preferred embodiment, the drain of the first pull down transistor PD21 and the drain of the second pull down transistor PD22 are electrically connected to the source of the third passing gate transistor PG3 and the source of the fourth passing gate transistor PG4 through metal lines (marked by dashed lines). As shown in FIG. 6, according to the third preferred embodiment, the drain of the first pull down transistor PD21 and the drain of the second pull down transistor PD22 are electrically connected to the source of the third passing gate transistor PG3 and the source of the fourth passing gate transistor PG4 through the seventh active region 64. Similarly, according to the first preferred embodiment, the drain of the third pull down transistor PD11 and the drain of the fourth pull down transistor PD12 are electrically connected to the source of the first passing gate transistor PG1 and the source of the second passing gate transistor PG2 through metal lines. According to the third preferred embodiment, the drain of the third pull down transistor PD11 and the drain of the fourth pull down transistor PD12 are electrically connected to the source of the first passing gate transistor PG1 and the source of the second passing gate transistor PG2 through the eighth active region 66.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An SRAM structure comprising:
   a substrate;
   a first active region, a second active region, a third active region and a fourth active region disposed on the substrate, wherein the first active region, the second active region, the third active region and the fourth active region are parallel to each other, do not connect to each other structurally and are arranged from left to right in a sequence of the third active region, the first active region, the second active region and the fourth active region;
   a first gate line disposed on the substrate, wherein the first gate line comprises a first part, a second part and a third part, the first part and the third part are perpendicular to the first active region, the second part is parallel to the first active region, the first part covers the first active region, the second active region and the fourth active region, the third part covers the fourth active region, the second part is disposed on an insulating region between the second active region and the fourth active region, and the second part contacts the first part and the third part;
   a second gate line disposed on the substrate, wherein the second gate line comprises a fourth part, a fifth part and a sixth part, the fourth part and the sixth part are perpendicular to the first active region, the fifth part is parallel to the first active region, the fourth part covers the first active region, the second active region and the third active region, the sixth part covers the third active region, and the fifth part covers the insulating region between the first active region and the third active region and contacts the fourth part and the sixth part;
   a fifth active region;
   a sixth active region, wherein the fifth active region and the sixth active region are parallel to the first active region, the third active region is disposed between the first active region and the fifth active region, the fourth active region is disposed between the sixth active region and the second active region, and the first active region, the second active region, the third active region, the fourth active region, the fifth active region and the sixth active region do not connect to each other structurally;
   a third gate line covering the sixth active region;
   a fourth gate line covering the sixth active region; a fifth gate line covering the fifth active region; and
   a sixth gate line covering the fifth active region.

2. The SRAM structure of claim 1, wherein the first part and the third part do not connect to each other structurally, and the fourth part and the sixth part do not connect to each other structurally.

3. The SRAM structure of claim 1, wherein:
   a first pull down transistor and a second pull down transistor are disposed in the third active region;
   a third pull down transistor and a fourth pull down transistor are disposed in the fourth active region;
   a first pull up transistor is disposed in the first active region; and
   a second pull up transistor is disposed in the second active region.

4. The SRAM structure of claim 3, wherein:
   a first passing gate transistor and a second passing gate transistor are disposed in the sixth active region; and
   a third passing gate transistor and a fourth passing gate transistor are disposed in the fifth active region.

5. The SRAM structure of claim 4, wherein the first pull up transistor, the second pull up transistor, the first pull down transistor, the second pull down transistor, the third pull down transistor and the fourth pull down transistor form two cross-coupled inverters.

6. The SRAM structure of claim 5, wherein the first passing gate transistor and the third passing gate transistor serve as a first terminal of the two cross-coupled inverters, and the second passing gate transistor and the fourth gate transistor serve as a second terminal of the two cross-coupled inverters.

7. The SRAM structure of claim 3, wherein the first part overlapping the fourth active region serves as a gate of the fourth pull down transistor, and the first part overlapping the first active region serves as a gate of the first pull up transistor.

8. The SRAM structure of claim 7, wherein a structure of the second part is the same as a structure of the gate of the fourth pull down transistor.

9. The SRAM structure of claim 7, wherein a structure of the second part is the same as a structure of the gate of the first pull up transistor.

10. An SRAM structure comprising:
a substrate;
a fifth active region, a third active region, a first active region, a second active region, a fourth active region and a sixth active region arranged in a sequence from left to right on the substrate, wherein the first active region, the second active region, the third active region, the fourth active region, the fifth active region and the sixth active region are parallel to each other;
a seventh active region contacting the third active region and the fifth active region, wherein the seventh active region is perpendicular to the fifth active region;
an eighth active region contacting the fourth active region and the sixth active region, wherein the eighth active region is perpendicular to the sixth active region;
a first gate line covering the first active region, the second active region and the fourth active region;
a second gate line covering the fourth active region, wherein the second gate line is parallel to the first gate line;
a third gate line covering the first active region, the second active region and the third active region;
a fourth gate line covering the third active region, wherein the fourth gate line is parallel to the third gate line;
a first metal line electrically connecting to the first gate line and the second gate line, wherein the first metal line is perpendicular to the eighth active region; and
a second metal line electrically connecting to the third gate line and the fourth gate line, wherein the second metal line is perpendicular to the seventh active region.

11. The SRAM structure of claim 10, wherein the first active region, the second active region, the third active region and the fourth active region do not connect to each other structurally.

12. The SRAM structure of claim 10, further comprising:
a third gate line and a sixth gate line covering the fifth active region, wherein the third gate line and the sixth gate line are perpendicular to the fifth active region; and
a seventh gate line and an eighth gate line covering the sixth active region, wherein the seventh gate line and the eighth gate line are perpendicular to the sixth active region.

13. The SRAM structure of claim 12, wherein:
a first pull down transistor and a second pull down transistor are disposed in the third active region;
a third pull down transistor and a fourth pull down transistor are disposed in the fourth active region;
a first pull up transistor is disposed in the first active region; and
a second pull up transistor is disposed in the second active region.

14. The SRAM structure of claim 13, wherein:
a first passing gate transistor and a second passing gate transistor are disposed in the sixth active region; and
a third passing gate transistor and a fourth passing gate transistor are disposed in the fifth active region.

15. The SRAM structure of claim 14, wherein the first pull up transistor, the second pull up transistor, the first pull down transistor, the second pull down transistor, the third pull down transistor and the fourth pull down transistor form two cross-coupled inverters.

16. The SRAM structure of claim 15, wherein the first passing gate transistor and the third passing gate transistor serve as a first terminal of the two cross-coupled inverters, and the second passing gate transistor and the fourth gate transistor serve as a second terminal of the two cross-coupled inverters.

17. The SRAM structure of claim 10, wherein part of the first metal line overlaps the eighth active region and part of the second metal line overlaps the seventh active region.

* * * * *